United States Patent [19]

Sekiya et al.

[11] Patent Number: 4,774,161
[45] Date of Patent: Sep. 27, 1988

[54] LIGHT-SENSITIVE COMPOSITION WITH POLYVINYL ACETAL RESIN AND DIAZO RESIN SALT OF LONG CHAIN ALIPHATIC BENZENE SULFONATE

[75] Inventors: Toshiyuki Sekiya; Roahiaki Aoai; Kazuo Maemoto; Akihiko Kamiya, all of Shizuoka, Japan

[73] Assignee: Fuji Photo Film Co., Ltd., Kanagawa, Japan

[21] Appl. No.: 3,244

[22] Filed: Jan. 14, 1987

[30] Foreign Application Priority Data

Jan. 21, 1986 [JP] Japan .................................. 61-10342

[51] Int. Cl.$^4$ ........................... G03C 1/54; G03C 1/60
[52] U.S. Cl. ..................................... 430/175; 430/163; 430/176
[58] Field of Search ......................... 430/175, 176, 163

[56] References Cited

U.S. PATENT DOCUMENTS

| 3,396,019 | 6/1968 | Uhlig .................................... 430/175 |
| 3,790,556 | 2/1974 | Doggett ............................... 430/188 |
| 4,123,276 | 10/1978 | Kita et al. ........................... 430/175 |
| 4,467,027 | 8/1984 | Yamamoto et al. ................. 430/176 |
| 4,631,245 | 12/1986 | Pawlowski ........................ 430/175 |

FOREIGN PATENT DOCUMENTS

| 0208145 | 1/1987 | European Pat. Off. |
| 0944884 | 12/1963 | United Kingdom ................ 430/163 |
| 1370316 | 10/1974 | United Kingdom . |
| 1396355 | 6/1975 | United Kingdom . |

Primary Examiner—Charles L. Bowers, Jr.
Attorney, Agent, or Firm—Burns, Doane, Swecker & Mathis

[57] ABSTRACT

The present invention relates to a light-sensitive composition comprising a modified polyvinyl acetal resin having a substituent possessing an acid hydrogen atom introduced into remaining hydroxy groups of a polyvinyl acetal resin in an amount of from 0.1 to 6 milliequivalents as acid content per 1 gram resin, and a diazo resin represented by the formula (I)

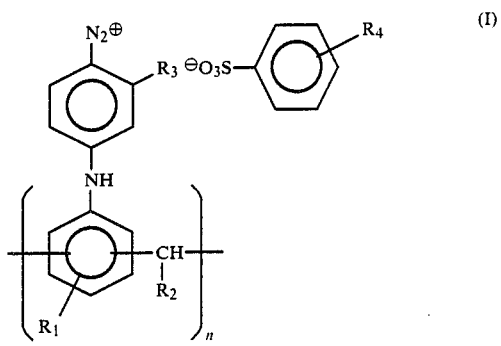

wherein $R_1$ represents a hydrogen atom, or a substituted or unsubstituted alkyl, alkoxy, hydroxy, carboxyester or carboxy group; $R_2$ represents a hydrogen atom, an alkyl group having 1 to 3 carbon atoms or a phenyl group; $R_3$ represents a hydrogen atom or an alkoxy group having 1 to 3 carbon atoms; $R_4$ represents an alkyl group having 6 to 18 carbon atoms; n represents an integer not smaller than 2.

The presensitized lithographic printing plate using the light-sensitive composition of the present invention can be developed with an alkali developer and the highlight image thereof is tough. The lithographic printing plate obtained from the presensitized plate has increased press life.

9 Claims, No Drawings

LIGHT-SENSITIVE COMPOSITION WITH POLYVINYL ACETAL RESIN AND DIAZO RESIN SALT OF LONG CHAIN ALIPHATIC BENZENE SULFONATE

BACKGROUND OF THE INVENTION (1) Field of the Invention

The present invention relates to a light-sensitive composition. More particularly, the present invention relates to a light-sensitive composition which can be developed with an alkali aqueous solution, and which is suitable for use in the making of a presensitized plate from which a lithographic printing plate having an increased press life and which has a tough image in highlight areas can be prepared.

(2) Description of the Prior Art

Diazonium compounds are widely used as sensitizers in presensitized printing materials, and the most commonly employed diazonium compounds are diazo resins, typically the condensation products of p-diazodiphenylamine and formaldehyde.

In preparing a light-sensitive layer for use in a presensitized lithographic printing plate, the diazo resin may be used either alone as shown in U.S. Pat. No. 2,714,066 (i.e., in the absence of any binder) or in admixture with a binder as described in Japanese Patent Application (OPI) (the term "OPI" (i.e. Open to Public Inspection)" as used herein means an unexamined published Japanese patent application) No. 30604/1975 corresponding to U.S. Pat. No. 4,275,138. In most of the diazo-sensitized lithographic printing plates manufactured today, a diazonium compound is used together with a polymer binder in order to provide for more increased press life.

Light-sensitive layers which comprise a diazonium compound and a polymer binder may be divided into two types, depending on the type of developer used to remove (i.e., develop) the layer in unexposed areas: (1) the "alkali" developable type of light-sensitive layer which is treated with an aqueous alkali developer, and (2) the "solvent" developable type of light-sensitive layer which is treated with an organic solvent-based developer (see U.S. Pat. No. 4,275,138). The alkali-developer type is increasingly used today, principally for safety and environmental reasons due to problems relating to disposal of the fatigued developer. How well this type of light-sensitive layer performs is determined by the properties of the binder used. The binder may be rendered alkali-developable either by copolymerizing it with a carboxylic acid-containing monomer as described in U.S. Pat. No. 4,275,138, or by reacting the hydroxyl group in polyvinyl alcohol with a cyclic acid anhydride such as phthalic anhydride to introduce the carboxylic acid group into the polymer as shown in U.S. Pat. No. 2,861,058. Whichever method is used, the resulting polymer has only a low level of abrasion resistance because of its structure, and the presensitized plate using this type of carboxylic acid-containing polymer as a binder in the light-sensitive layer provides a lithographic printing plate having a short press life. When polyvinyl acetal is used as the binder, a sturdy film is formed having high abrasion resistance; however, the lithographic printing plate sensitized by a layer containing polyvinyl acetal as the binder is of the organic solvent-developable type described above and cannot be treated with aqueous alkali developers.

It has been proposed that the abrasion-resistant polyvinyl acetal resin be modified to make the resin alkali-soluble. For instance, as described in British Pat. No. 1,396,355 a method in which vinyl acetate and a carboxylic acid-containing monomer are copolymerized and the resulting polymer is saponified and converted to the acetal form is proposed. However, the modified polyvinyl acetal obtained by this method does not exhibit satisfactory abrasion-resistance.

The abrasion-resistance of polyvinyl acetate resin was not impaired by the method consisting of introducing a substituted group having an acid hydrogen atom into remaining hydroxide group in a polyvinyl alcohol resin (herein referred to as "PVA resin") which had previously been converted to the acetal form. Examples of such types of methods include a method as described in British Pat. No. 1370316 in which arylsulfonylurethane is introduced into a PVA resin, a method as described in German Patent Publication (OLS) No. 3404366, European Patent Publication No. 208145 in which an intermolecular acid anhydride of organic polycarboxylic acid is reacted with PVA resin, and a method in which an ingredient containing hydroxyl groups or cyano groups is introduced into PVA resin reacted with the intermolecular acid anhydride. However, a presensitized lithographic printing plate obtained by using this modified polyvinyl acetal resin as a binder has a disadvantage in that an image on the highlight portion peels off when the plate is subjected to strong stress on development.

SUMMARY OF THE INVENTION

The present invention has been accomplished with a view toward solving the aforementioned problems of the prior art techniques discussed above.

An object of the present invention is, therefore, to provide a light-sensitive composition which can be developed with an alkali aqueous solution and which is suitable for use in the making of a presensitized plate from which there can be obtained a lithographic printing plate having an increased press life and which has a tough image on the highlight portion.

The present invention relates to a light-sensitive composition comprising a modified polyvinyl acetal resin having a substituent possessing an acid hydrogen atom introduced into remaining hydroxy groups of a polyvinyl acetal resin in an amount of from 0.1 to 6 milliequivalent as acid content per 1 gram resin, and a diazo resin represented by the formula (I)

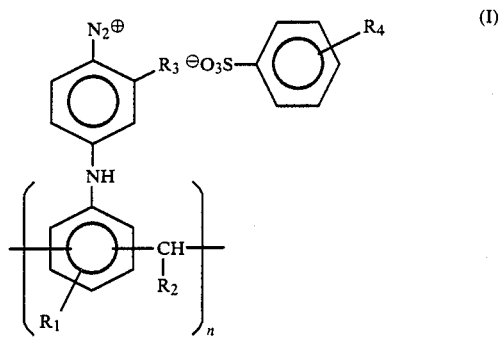

wherein $R_1$ represents a hydrogen atom or a substituted or unsubstituted alkyl, alkoxy, hydroxy, carboxyester or carboxy group; $R_2$ represents a hydrogen atom, an alkyl group having 1 to 3 carbon atoms or phenyl group; $R_3$ represents a hydrogen atom or an alkoxy group having 1 to 3 carbon atoms; $R_4$ represents an alkyl group having 6 to 18 carbon atoms; and n represents an integer not smaller than 2.

DETAILED DESCRIPTION OF THE INVENTION

The "modified polyvinyl acetal resin" contained in the light-sensitive composition of the present invention is a polyvinyl acetal resin modified by introducing a substituent having an acid hydrogen atom into remaining hydroxyl group in an amount of from 0.1 to 6 milliequivalent as acid content per 1 gram resin and is soluble or swellable in an alkali aqueous solution. By "a substituent having acid hydrogen atom" is meant a group having 6 or less of acid dissociation constant (pKa). Examples of such substituent include carboxylic acid (—COOH) and sulfonylurethane (—SO$_2$NHCOO—). If the acid content per 1 gram resin is less than 0.1 milliequivalent, developability in an alkali developing solution is reduced. If the acid content is more than 6 milliequivalent, deterioration of abrasion-resistance occurs. The acid content is preferably from 0.5 to 4 milliequivalent.

Examples of the modified polyvinyl acetal resin include a resin containing arylsulfonyurethane as described in British Pat. No. 1,370,316, a resin prepared by reacting polyvinyl acetal resin with intermolecular acid anhydride of organic polycarboxylic acid as described in German Patent Publication No. 3404366 and European Patent Publication No. 208145 and a resin prepared by introducing a substituent containing hydroxyl group or cyano group into the polyvinyl acetal resin previously reacted with intermolecular acid anhydride. As a preferred example of a modified polyvinyl acetal resin there can be mentioned one having the following formula (II):

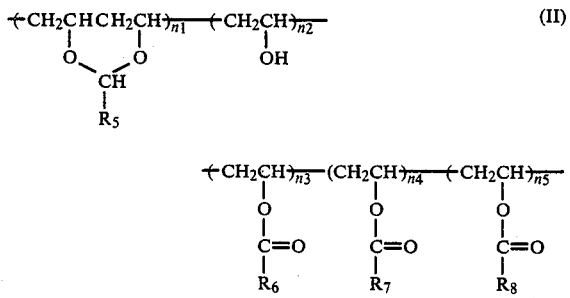

In this formula, $R_5$ represents a substituted or unsubstituted alkyl group, carboxyl group, dialkylamino group or a hydrogen atom; $R_6$ represents an unsubstituted alkyl group; $R_7$ represents an aliphatic or aromatic hydrocarbon group having carboxylic acid; $R_8$ represents a substituted or unsubstituted aliphatic or aromatic hydrocarbon group having at least one of hydroxyl group or nitrile group; $n_1$, $n_2$, $n_3$, $n_4$ and $n_5$ represent mole% of recurring units and have the following ranges respectively: $n_1=5-85$, $n_2=0-60$, $n_3=0-20$, $n_4=3-60$, $n_5$=more than 0 and less than 60.

The resin represented by the formula (II) may be obtained by the following procedures: (1) polyvinyl alcohol is converted to the acetal form by treatment with an aldehyde; (2) the remaining hydroxyl group (—OH) of the resulting acetal is reacted with acid anhydride; and (3) a part of the resulting carboxylic acid compound is reacted with a halogen-substituted compound containing hydroxyl group or cyano group.

The resin represented by the general formula (II) comprises the five recurring monomer units. The first component, having $n_1$ designating its molar percent, is a vinyl acetal monomer unit: the second component, having $n_2$ designating its molar percent is a vinyl alcohol monomer unit; the third component, having $n_3$ designating its molar percent is an unsubstituted ester monomer unit: the fourth component, having $n_4$ designating its molar percent is an ester monomer unit having a carboxyl group; and the fifth component, having $n_5$ designating its molar percent, is an ester bond-containing monomer unit having a hydroxyl or cyano group. Each of these components may have one or more constituent units.

The first vinyl acetal monomer unit is formed by reacting a vinyl alcohol unit with an aliphatic aldehyde which may be substituted by, e.g., a carboxyl group, a hydroxyl group, a chlorine atom, a bromine atom, a tertiary amino group, an alkoxy group, a cyano group, a nitro group, an amido group, an ester group, a urethane group or an ureido group. Illustrative aliphatic aldehydes include formaldehyde, acetaldehyde, propionaldehyde, butylaldehyde, pentylaldehyde, hexylaldehyde, glyoxylic acid, N,N-dimethyl-formamido-di-n-butylacetal, bromoacetaldehyde, chloroacetaldehyde, 3-hydroxy-n-butylaldehyde, 3-methoxy-n-butylaldehyde, 3-(dimethylamino)-2,2-dimethylpropionaldehyde and cyanoacetaldehyde. It should, however, be understood that these are not exclusive examples of the aliphatic aldehyde serving as a reactant for the formation of the first vinyl acetal monomer unit. Examples of substituent $R_5$ in the first monomer unit include hydrogen atom, methyl, ethyl, n-propyl, n-butyl, n-pentyl, bromomethyl, chloromethyl, 3-hydroxypropyl, 3-methoxypropyl, 3-(dimethylamino)-2, 2-dimethylethyl, cyanomethyl, carboxyl and N,N-dimethylamino group.

Substituent $R_6$ in the third monomer unit is an unsubstituted alkyl group having from 1 to 10 carbon atoms, and a methyl or ethyl group is particularly preferred from the viewpoint of developability.

Substituent $R_7$ in the forth monomer unit is an aliphatic or aromatic hydrocarbon group substitued by a carboxyl group and having from 1 to 20 carbon atoms. This monomer unit is formed by reacting an acid anhydride with the residual —OH group in polyvinyl acetal. Typical examples of the acid anhydride are succinic anhydride, maleic anhydride, phthalic anhydride, trimellitic anhydride and cis-4-cyclohexane-1,2-dicarboxylic anhydride, but other cyclic acid anhydrides may be employed. Examples of substituent $R_7$ include 2-carboxyethyl, carboxyvinyl, 2-carboxyphenyl, 2,4-dicarboxyphenyl, 2,5-dicarboxyphenyl and 2-carboxy-cis-4-cyclohexenyl group.

It should be noted that $R_7$ may be further substituted in addition to the carboxyl group. Examples of such additional substituents include:

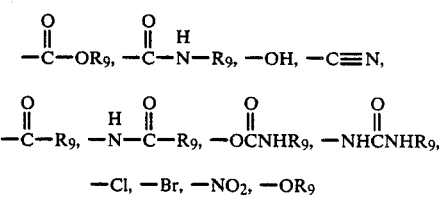

wherein $R_9$ represents, for example, a substituted or unsubstituted alkyl group, aralkyl group or aryl group having from 1 to 20 carbon atoms. Illustrative substituents when $R_9$ is substituted are —OH, —C≡N, —Cl, —Br and —NO$_2$.

Substituent $R_8$ in the fifth mononer unit is an aliphatic or aromatic hydrocarbon group substituted by a hydroxyl or cyano group and may be obtained by esterifying the reaction product of the carboxylic acid in $R_7$ in the fourth monomer unit with a halogen-substituted compound further substituted with a hydroxyl or cyano group. Illustrative but by no means limiting examples of $R_8$ are listed below:

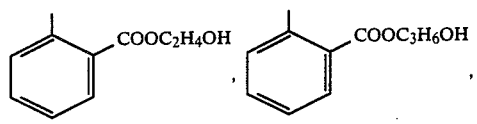

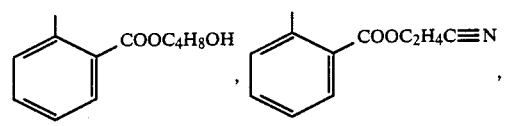

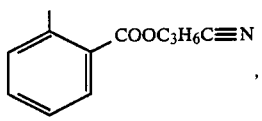

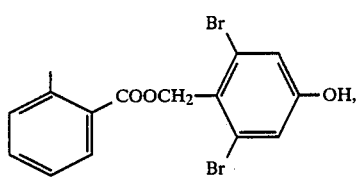

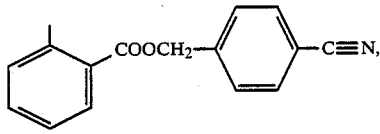

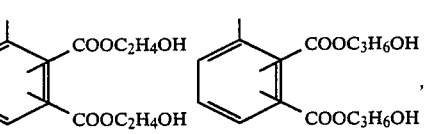

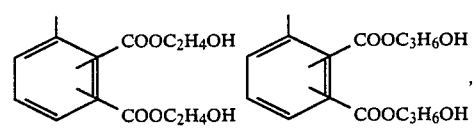

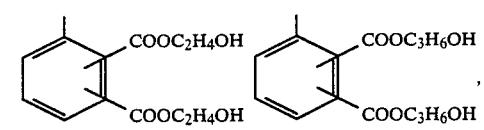

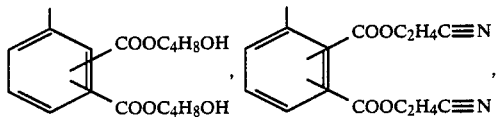

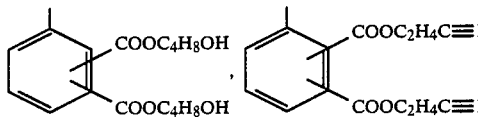

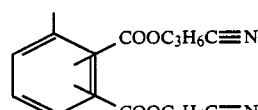

-continued

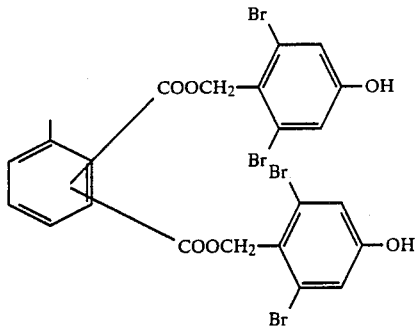

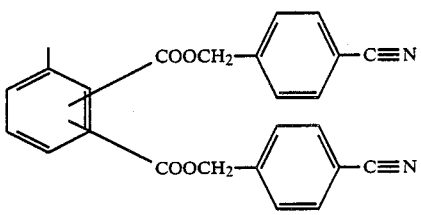

$\overset{|}{C_2H_4COOC_2H_4OH}$, $\overset{|}{C_2H_4COOC_3H_6OH}$, $\overset{|}{C_2H_4COOC_4H_8OH}$, $\overset{|}{C_2H_4COOC_2H_4C≡N}$, $\overset{|}{C_2H_4COOC_3H_6C≡N}$,

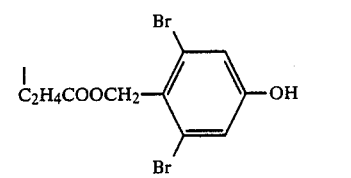

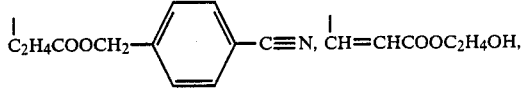

$\overset{|}{CH=CHCOOC_3H_6OH}$, $\overset{|}{CH=CHCOOC_4H_8OH}$, $\overset{|}{CH=CHCOOC_2H_4C≡N}$, $\overset{|}{CH=CHCOOC_3H_6C≡N}$,

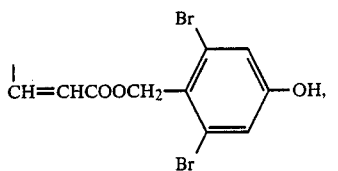

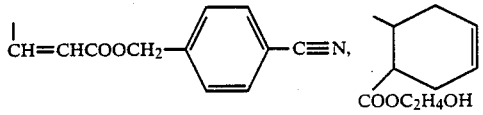

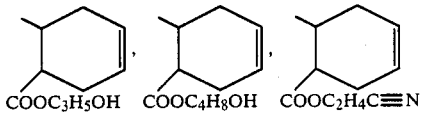

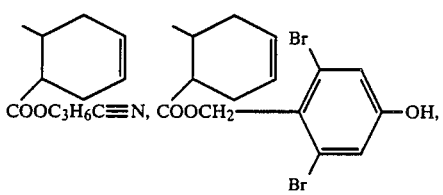
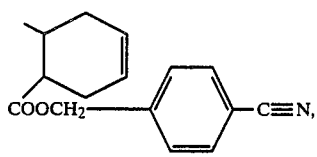
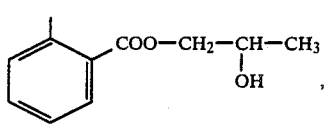
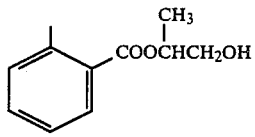
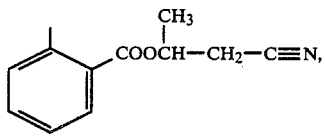
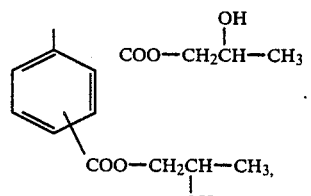
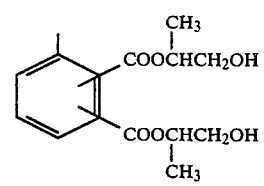
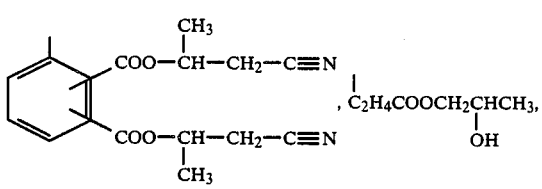
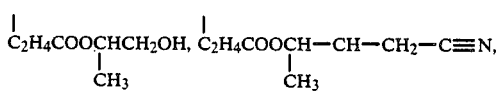
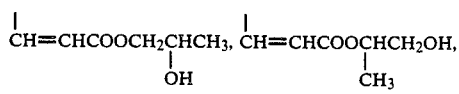
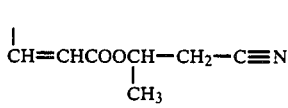
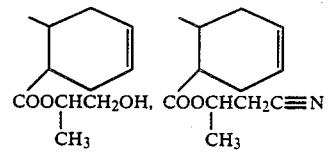
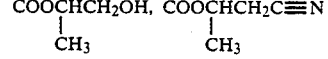

The range of $n_1$ in the general formula (II) is from about 5 to about 85 mol%, preferably 25–70 mol%. The film strength undesirably decreases by decreasing the value of $n_1$ below about 5 mol%. Increasing the value of $n_1$ above about 85 mol% is also undesirable since this leads to a decrease in the proportion of the other components.

The range of $n_2$ is from 0 to about 60 mol%, preferably 0 to 30 mol%. The range of $n_3$ is from 0 to about 20 mol%, preferably 0 to 15 mol%.

The range of $n_4$ is from about 3 to about 60 mol%, preferably 10–55 mol%. Increasing the value of $n_4$ above about 60 mol% causes excessive swelling in exposed areas upon contact with an alkali developer. On the other hand, decreasing the value of $n_4$ below about 3 mol% causes difficulty in development with an alkali developer.

The range of $n_5$ is such that it is greater than 0 mol% and is not greater than about 60 mol%. Preferably, $n_5$ is within the range of 3–40 mol%. Increasing the value of $n_5$ above about 60 mol% is undesirable since this leads to a decrease in the proportion of the other components.

The appropriate range of the molecular weight of the modified polyvinyl acetal resin is from about $5 \times 10^3$ to about $4 \times 10^5$ as measured by gel permeation chromatography, and a preferred range is from $5 \times 10^4$ to $3 \times 10^5$.

The modified polyvinyl acetal resins described above may be used either alone or in admixture. The light-sensitive composition of the present invention contains these modified polyvinyl acetal resins in amounts ranging from about 50 to about 99.5 wt%, preferably from 55 to 95 wt%.

The light-sensitive composition of the present invention may contain other resins in amounts not exceeding about 50 wt% of the above-described resin. Examples of resins include miscible resins which contain a hydroxyl group, an amido group or urethane group; more illustrative examples are polyamide, epoxy, polyurethane and acrylic resins. Some improvement in adhesion may be attained by incorporating these additional resins.

Examples of $R_1$ in the formula (I) of the diazo resin contained in the light-sensitive composition of the present invention include a hydrogen atom; methyl, ethyl, n-propyl, iso-propyl, methoxy, ethoxy, n-propoxy, iso-propoxy, hydroxymethyl, β-hydroxyethyl, γ-hydroxypropyl, methoxymethyl, ethoxymethyl, β-methoxymethyl, β-ethoxymethyl, hydroxy, carboxy, carbomethoxy, or carboethoxy located at the 4'-position. $R_1$ also includes position isomers located at the 2'- or 3'-position. $R_1$ is preferably a hydrogen atom, methyl, methoxy, hydroxy or carboxy group located at the 4'-position, and most preferably a hydrogen atom.

Examples of $R_2$ include a hydrogen atom, methyl, ethyl, n-propyl, iso-propyl, pheny group and the like. The most preferably is a hydrogen atom.

Examples of $R_3$ include a hydrogen atom, methoxy, ethoxy, n-propoxy, iso-propoxy group and the like. The most preferably is a hydrogen atom.

Examples of $R_4$ include a linear or branched alkyl having 6 to 18 carbon atoms such as n-hexyl, n-heptyl, n-octyl, n-nonyl, n-decyl, n-undecyl, n-dodecyl, n-tridecyl, n-tetradecyl, n-pentadecyl, n-hexadecyl, n-heptadecy and n-octadecyl located at the 2-, 3- or 4-position. $R_4$ is preferably an alkyl having 12 carbon atoms, most preferably a linear one, namely n-dodecyl, located at the 4-position.

The combination of the dizao resin represented by the formula (I) and the above-mentioned modified polyvinyl acetal resin increases the press life of the printing plate and provides a tough image on the highlight portion. The combination of the diazo resin with the other binder, for example, a resin obtained by copolymerizing vinyl acetate and a carboxylic acid containing monomer, saponifying and converting the resulting polymer to the acetal form as described in British Pat. No. 1,396,355 or an acryl type binder described in U.S. Pat. No. 4,123,276, did not lead to the advantages obtained by the present invention.

The diazo resin represented by the formula (I) used in this invention may be prepared as follows: a substituted or unsubstituted 4-diazodiphenylamine and active carbonyl compound such as formaldehyde, acetoaldehyde or benzaldehyde are condensed in the mole ratio of 1:1 to 1:0.5, preferably 1:0.8 to 1:0.6, in an acid medium and the obtained condensation product is reacted with an acid represented by

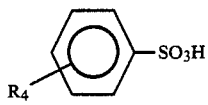

or a salt thereof to form the diazo resin.

The content of the diazo resin in the light-sensitive composition of the present invention ranges from 1 to 50 wt%, preferably 3 to 20 wt%. A composition containing less than 1 wt% of the diazo resin is not light-crosslinked sufficiently by exposure. On the other hand, a composition containing more than 50 wt% of the diazo resin tends to exhibit lower sensitivity. The light-sensitive composition of the present invention may contain diazo resins described in British Pat. No. 1,207,878 and Japanese patent application (OPI) No. 222834/1984 together with the diazo resin represented by the formula (I) in an amount equivalent to 50 wt% or less of the diazo resin having the formula (I).

The light-sensitive composition of this invention may further contain various additives if necessary and, for example, the following additives may be contained in the composition: alkyl ethers such as ethylcellulose or methylcellulose and fluorine containing surface active agent for improvement of coatability; plasicizers (such as tricresydylphosphate, dimethylphthalate, dibutylphthalate, trioctyl phosphate, tributyl phosphate, tributyl citrate, polyethylene glycol and polypropylene glycol) for enhancing the flexibility and abrasion-resistance of the coating film; colorants (such as acrydine dye, dianine dye, styryle dye, triphenymethane dye and pigment such as phthalocyanine) for making the developed image visible; and usual stabilizers for diazo resins (such as phosphoric acid, phosphorous acid, pyrophosphoric acid, oxalic acid, boric acid, p-toluensulfonic acid, benzensulfonic acid, p-hydroxybenzensulfonic acid, 2-methoxy-4-hydroxy-5-benzoyl-benzensulfonic acid, malic acid, tartaric acid, dipicolinic acid, polyacrylic acid and copolymer thereof, polyvinylphosphonic acid and copolymer thereof, polyvinylsulfonic acid and copolymer thereof, 5-nitronaphthalene-1-phosphonic acid, 4-chlorophenoxymethylphosphonic acid, sodium phenyl-methylpyrazolonesulfonate, 2-phosphonobutanetricarbonic acid-1,2,4,1-phosphonoethanetricarbonic acid-1,2,2,1-hydroxyethane-1,1-disulfonic acid. The addition amount of these additives varies depending on the object and ranges from 0.5 to 30 wt% of the total solid content of the light-sensitive layer.

The light-sensitive composition of this invention is dissolved in a suitable organic solvent and is coated on a support having a hydrophilic surface, in an amount of from 0.5 to 5 g/m$^2$, the coating weight being calculated on a dry basis, to obtain a light-sensitive lithographic printing plate. The concentration of the light-sensitive composition in a sensitizer solution preferably ranges from 1 to 50 wt%. Examples of usable solvents include methyl cellosolve, ethyl cellosolve, 1-methoxy-2-propanole, methyl cellosolve acetate, acetone, methylethylketone, methanol, dimethylformamide, dimethylsulfoxide, ethylene dichloride, dicylohexanone, dioxane, tetrahydrofurane and mixtures thereof. A solvent comprising the above solvent or a mixture thereof and a small amount of a solvent (such as water or toluene) which does not dissolve high molecular compounds such as the diazo resin may be also used as a solvent. When the sensitizer solution obtained by dissolving the light-sensitive composition in the above-mentioned solvent is coated and dried, the coated composition is preferably dried at from 50° to 120° C. The drying may be conducted by predrying at a low temperature and followed by drying at an elevated temperature, or, when a suitable solvent is used, may be conducted by drying at an elevated temperature without predrying.

The lithographic printing plate having light-sensitive layers coated on the support with a hydrophilic surface is imagewise exposed, followed by the development with a developer comprising a weak alkali aqueous solution to provide a relief image which is negative relative to the original image. Light sources that may be suitably used in the exposure step include a carbon arc lamp, a mercury lamp, a xenon lamp, a metal halide lamp, a strobo and an ultraviolet laser light source. The developer for the lithographic printing plate having the light-sensitive layer of this invention may, for example, be an alkali aqueous solution comprising an organic solvent whose solubility in water at normal temperature is 10 wt% or less (such as benzylalcohol, ethyleneglycol monophenylether), alkali agent (such as triethanolamine, monoethanolamine), anionic surface active agent (such as aromatic sulfonate, dialkylsulfosuccinate, alkylnaphthalenesulfonate,

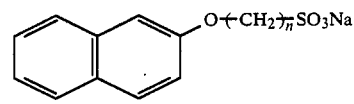

(n = 1-10)

-continued

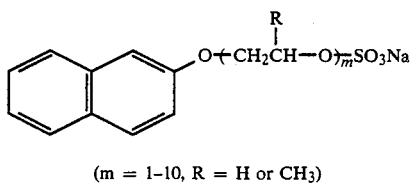

(m = 1–10, R = H or CH₃)

branched alkyl sulfate) and water, and further comprising, when necessary, an anti-contamination agent (such as sodium sulfite, sodium salt of sulfopyrazolone) and water softener (such as ethylenetetraacetic acid 4Na, N—(CH$_2$COONa)3).

The support on which the light-sensitive composition of this invention is coated is preferably a hydrophilic treated aluminum plate. The aluminum plate preferably has a tough passive state film on the surface thereof and the film may be prepared by roughening the surface by wirebrush graining, brush graining, roughening the surface with a slurry of abrasive particles using a nylon brush, ball graining, chemical graining, electrolytic graining or a combination of the above-mentioned graining techniques, or by anodizing the roughened film in sulfonic acid, phosphoric acid, oxalic acid, boric acid, chromic acid, sulfamic acid or mixture thereof by using direct current or alternating current. The surface of aluminum having the passive state film thereon exhibits hydrophilicity and the surface may preferably be to make it hydrophilic by treatments such as the silicate (sodium silicate, potassium ailicat) treatment described in U.S. Pat. Nos. 2,714,066 and 3,181,461; the potassium fluorozirconate treatment described in U.S. Pat. No. 2,946,638; the phosphomolybydate treatment described in U.S. Pat. No. 3,201,247; the polyacrylic acid treatment described in British Pat. No. 815,417; the polyvinyl phosphonic acid treatment described in British Pat. No. 950,761 and British Pat. No. 1,230,447; the phosphonic acid treatment described in Japanese patent publication No. 6409/1969; the futinic acid treatment described in U.S. Pat. No. 3,307,951; the combination treatment of hydrophilic organic high molecular compound and divalent metal described in Japanese patent application (OPI) No. 16893/1983 and U.S. Pat. No. 4,427,766; and the hydrophilic coating of water soluble polymer having sulfonic acid group. Another example of hydrophilic treatment is electrodeposition using a silicate as described in U.S. Pat. No. 3,658,662.

The following Examples further illustrate the present invention but are not intended to limit the scope of the invention in any manner. In the Examples, all percents are by weight.

EXAMPLE 1

A three-necked round-bottom flask (capacity: 1,000 ml) equipped with a thermometer, a reflux condenser and a stirrer was charged with 60 g of polyvinyl butyral (Denka Butyral #4000-2, manufactured by Denki Kagaku Kogyo K.K.) in 720 ml of acetic acid. The mixture was heated to form a solution. After raising the temperature in the flask to 100° C., 89.8 g of phthalic anhydride and 60.5 g of sodium acetate were added and the resulting mixture was allowed to react for 3 hours. Thereafter, this reaction mixture was added slowly to 10 liters of a solution of methanol and water (1:3) to form a solid precipitate. This precipitate was vacuum-dried to obtain polymer (A) in an amount of 64.8 g. The acid content of the polymer was 2.72 meq/g.

A three-necked round-bottom flask (capacity: 1000 ml) equipped with a thermometer, a reflux condenser and a stirrer was charged with 45 g of the modified polyvinyl butyral (A) obtained above. The polymer was dissolved in 450 ml of N,N-dimethylformamide by heating. After raising the temperature in the flask to 80° C., 6.91 g of potassium carbonate and 6.24 g of ethylene bromohydrin were added and the resulting mixture was allowed to react for 3 hours. Thereafter, this reaction mixture was added slowly to 5,000 ml of a solution of water and acetic acid (19:1) to form a solid precipitate. The solid matter was vacuum-dried to obtain polymer (B) in an amount of 38.4 g. The acid content of the polymer was 1.48 meq/g.

Aluminum plates 0.24 mm thick were grained with a nylon brush and an aqueous suspension of pumice powder (400 mesh). After thorough washing with water, the plates were etched by immersion in a 10% aqueous solution of sodium hydroxide for 60 seconds at 70° C. The etched plates were washed under flushing water, neutralized with 20% nitric acid and washed again. The plates were then roughened by the electrochemical method described in Japanese patent application (OPI) No. 67507/1978 (wherein an alternating sinewave current ($V_A$, 12.7 volts; $V_C$, 9.1 volts) was applied to a 1% aqueous solution of nitric acid such that the quantity of electricity at the anode time was 160 coulmbs/dm²). The plates were then desmutted by immersion in a 30% aqueous solution of sulfuric acid for 2 minutes at 55° C. Thereafter, the plates were anodized in a 7% aqueous solution of sulfuric acid to provide an anodic film with a thickness of 2.0 g/m². The anodized plates were immersed in a 3% aqueous solution of sodium silicate for 1 minute at 70° C., and subsequently washed with water and dried. The thus prepared aluminum plates were coated with sensitizing solution-1 having the formulation indicated below, and then dried by heating at 80° C. for 2 minutes to obtain a presensitized plate ①. The coating weight of each sensitizer layer was 2.0 g/m² on a dry basis.

| Sensitizer Solution-1 | |
|---|---|
| Components | Amounts |
| 4-(n-dodecylbenzene-sulfonate) of the condensation product of 4-diazodiphenylamine and formaldehyde (diazo resin 1) | 0.5 g |
| Polymer (B) | 5.0 g |
| Oil-soluble dye (Victoria Pure Blue BOH) | 0.1 g |
| Malic acid | 0.05 g |
| 2-Methoxyethanol | 100.00 g |

The presensitized plate ① was imagewise exposed for 1 minute under 2 kW metal halide lamp (PS Light, Fuji Photo Film K.K.) placed at a distance of 1 m. Thereafter, the plate was immersed in an alkali developing solution (for its formulation, see below) for 1 minute at room temperature. The surfaces of the plates were rubbed lightly with an absorbent cotton to remove the unexposed areas, thereby producing lithographic printing plate (I) carrying a light blue image.

| Developing Solution | |
| --- | --- |
| Components | Amounts |
| Sodium sulfite | 5 g |
| Benzyl alcohol | 30 g |
| Sodium carbonate | 5 g |
| Sodium Isopropylnaphthalenesulfonate | 12 g |
| Water | 1,000 g |

According to the procedures above, lithographic printing plates (II), (III) and (IV) were prepared by exposing and developing presensitized plates ②, ③ and ④ obtained by using comparative sensitizer solutions-2, 3 and 4.

The sensitizer solution-2 had the same composition as that of the sensitizer solution-1 except that hexafluorophosphate of the condensation product of 4-diazodiphenylamine and formaldehyde (diazo resin 2) was used in place of the diazo resin 1.

The sensitizer solution-3 had the same composition as that of the sensitizer solution-1 except that the reaction product of crotonic acid-vinyl acetate copolymer (content of crotonic acid: 5 wt%) and 4-chlorobenzaldehyde was used in place of the polymer (B).

The sensitizer solution-4 had the same composition as that of the sensitizer solution-3 except that the diazo resin 2 was used in place of the diazo resin 1.

The abrasion-resistance of the lithographic printing plates (I) to (IV) obtained above and the toughness of the highlight image of the presensitized lithographic printing plates ① to ④ when the image was rubbed with absorbent cotton on development were tested and the results were as shown in Table 1. The abrasion-resistance test was conducted by using a printing press (Model GTO of Heidelberger AG). Further, the toughness of the highlight image was estimated as follows: when the image relative to step number 12 of a halftone wedge (UGRA-GRETAG plate control wedge PCW sold by Mika Electronics K.K.) having 120 lines/cm came off by rubbing with absorbent cotton five times on development, the plate was evaluated as "weak" and when the image did not come off, the plate was evaluated as "tough".

TABLE 1

| Printing plate | Impressions (copies) | Presensitized plate | Toughness of highlight image |
| --- | --- | --- | --- |
| (I) this invention | 200,000 | ① this invention | tough |
| (II) comparison | 150,000 | ② comparison | weak |
| (III) comparison | 100,000 | ③ comparison | weak |
| (IV) comparison | 100,000 | ④ comparison | weak |

As seen from the results in Table 1, the presensitive lithographic printing plate obtained by using the compound of this invention was quite advantageous.

EXAMPLE 2

An apparatus of the same type as used in Example 1 was charged with 60 g of polyvinyl propional (52 mol% propional unit and 48 mol% vinyl alcohol unit) which was dissolved in 720 ml of acetic acid by heating. After raising the temperature in the apparatus to 100° C., 230 g of phthalic anhydride and 60.5 g of sodium acetate were added and the resulting mixture was allowed to react for 3 hours. Thereafter, the reaction mixture was precipitated as in Example 1 to obtain 61.5 g of polymer (C) with an acid content of 2.82 meq/g.

45 g of the modified polyvinyl propional (C) prepared above was dissolved in 450 ml of N,N-dimethylformamide by heating. After raising the temperature in the apparatus containing the mixture to 80° C., 7.3 g of potassium carbonate and 6.55 g of ethylene bromohydrin were added and the resulting mixture was allowed to react for 3 hours. Thereafter, the reaction mixture was added slowly to 10 liters of a solution of water and acetic acid (19:1) to form a solid precipitate. The solid precipitate was vacuum-dried to obtain polymer (D) in an amount of 41.8 g. The acid content of the polymer was 1.27 meq/g.

The sensitizer solution-6 was coated on an aluminum plate by the procedure of Example 1. The toughness of the highlight image of the resulting presensitized lithographic printing plate on development was tested. The printing plate exhibited high abrasion-resistance (180,000 copies).

| Sensitizer solution-6 | |
| --- | --- |
| n-decylbenzene sulfonate of the condensation product of 4-diazodiphenylamine and formaldehyde | 0.5 g |
| polymer (D) | 5.0 g |
| Oil blue #603 (Orient Chemical Industry K.K.) | 0.12 g |
| Phosphrous acid | 0.05 g |
| Tricresylphosphate | 0.2 g |
| 2-Methoxyethanol | 100 g |

EXAMPLE 3

2,5-dibromo-4-hydroxybenzylbromide (17.2 g) was added to polymer (A) used in Example 1 by the same procedures as those of Example 1 to provide polymer (E). The presensitized plate was prepared by coating a sensitizer solution having the same composition as that of the sensitizer solution-1 used in Example 1 except that the same amount of polymer (E) was used instead of polymer (B) on an aluminum plate by the same procedure as that of Example 1. When the presensitized plate was imagewise exposed and developed in the same manner in Example 1, the highlight image of the presensitized printing plate was tough on development and exhibited good abrasion-resistance.

EXAMPLE 4

Denka butyral #4000-2 (Denki Kagaku Kogyo K.K.) (11.3 g) was dissolved in tetrahydrofuran anhydride (170 g). The mixture of propenylsulfonylisocyanate (5.11 g) and tetrahydrofuran (30 g) was dropwise added to the resulting mixture at room temperature over 15 minutes. The obtained solution was agitated at room temperature for 4 hours and poured in water (5 liter) to precipitate polymer. The precipitated polymer was suction filtered, and dried to obtain white polymer (F).

A sensitizer solution having the same composition as that of the sensitizer solution-1 used in Example 1 except that the polymer (F) was used instead of the polymer (B) was coated on an aluminum plate by the same procedures as those of Example 1 to provide a presensitized plate. The resulting printing plate prepared from the thus obtained presensitized plate in the same manner as in Example 1 was tough and the abrasion resistance was such that there was no deterioration in image quality after 180,000 impressions. For comparison, the diazo resin, which was obtained by preparing from 3-methoxydiphenylamine-4-diazoniumsulfate (1 mole) and 4,4′-bismethoxymethyl-diphenylether (1 mole) and isolating as mesitylene sulfonate, was used instead of the diazo resin 1 and a presensitized lithographic printing plate was obtained. The toughness of the image of the printing plate was insufficient and the abrasion-resistance was such that there was no deterioration in image quality after 120,000 impressions.

ADVANTAGES OF THE PRESENT INVENTION

The presensitized lithographic printing plate using the light-sensitive composition of the present invention can be developed with an alkali developer and the highlight image thereof is tough. The lithographic printing plate obtained from the presensitized plate has increased press life.

We claim:

1. A light-sensitive composition comprising about 50 to about 99.5 wt% based on the weight of the light-sensitive composition of a modified polyvinyl acetal resin represented by formula (II):

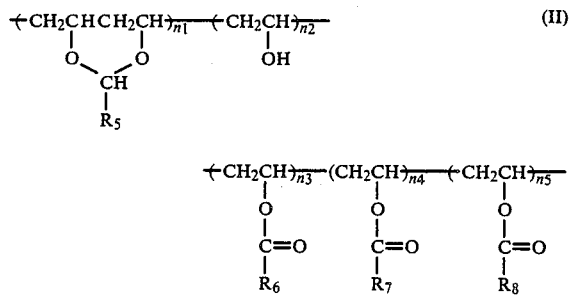

wherein $R_5$ represents a substituted or unsubstituted alkyl group, carboxyl group, dialkylamino group or a hydrogen atom; $R_6$ represents an unsubstituted alkyl group; $R_7$ represents an aliphatic or aromatic hydrocarbon group having carboxylic acid group; $R_8$ represents a substituted or unsubstituted aliphatic or aromatic hydrocarbon group having at least one of hydroxy group or nitrile group; and $n_1$, $n_2$, $n_3$, $n_4$ and $n_5$ represent mole% of recurring units and have the following ranges respectively: $n_1 = 5$ to 85, $n_2 = 0$ to 60, $n_3 = 0$ to 20, $n_4 = 3$ to 60 and $n_5 =$ more than 0 and not more than 60, in admixture with from about 1 to about 50 wt% based on the weight of the light-sensitive composition of a light-sensitive diazo resin represented by the formula (I):

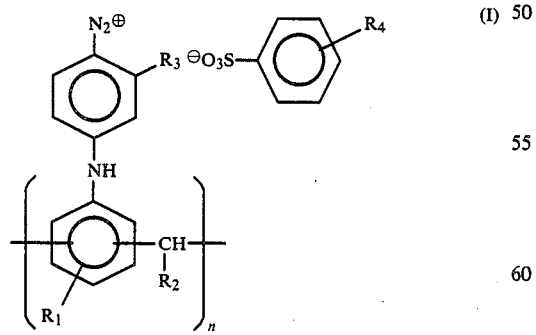

wherein $R_1$ represents a hydrogen atom, or substituted or unsubstituted alkyl, alkoxy, hydroxy, carboxyester or carboxy group; $R_2$ represents a hydrogen atom, an alkyl group having 1 to 3 carbon atoms or a phenyl group; $R_3$ represents a hydrogen atom or an alkoxy group having 1 to 3 carbon atoms; $R_4$ represents an alkyl group having 6 to 18 carbon atoms; n represents an integer not smaller than 2.

2. The light-sensitive composition of claim 1 wherein $R_4$ is n-dodecyl located at the 4-position.

3. The light-sensitive composition of claim 1 wherein $R_5$ is hydrogen atom, methyl, ethyl, n-propyl, n-butyl, n-pentyl, bromomethyl, chloromethyl, 3-hydroxypropyl, 3-methoxypropyl, 3-(dimethylamino)-2,2-dimethylethyl, cyanomethyl, carboxyl or N,N-dimethylamino group; $R_6$ is methyl or ethyl group; $R_7$ is 2-carboxyethyl, carboxyvinyl, 2-carboxyphenyl, 2,4-dicarboxyphenyl, 2,5-dicarboxyphenyl, or 2-carboxy-cis-4-cyclohexenyl group; $R_8$ is a group selected from the group consisting of

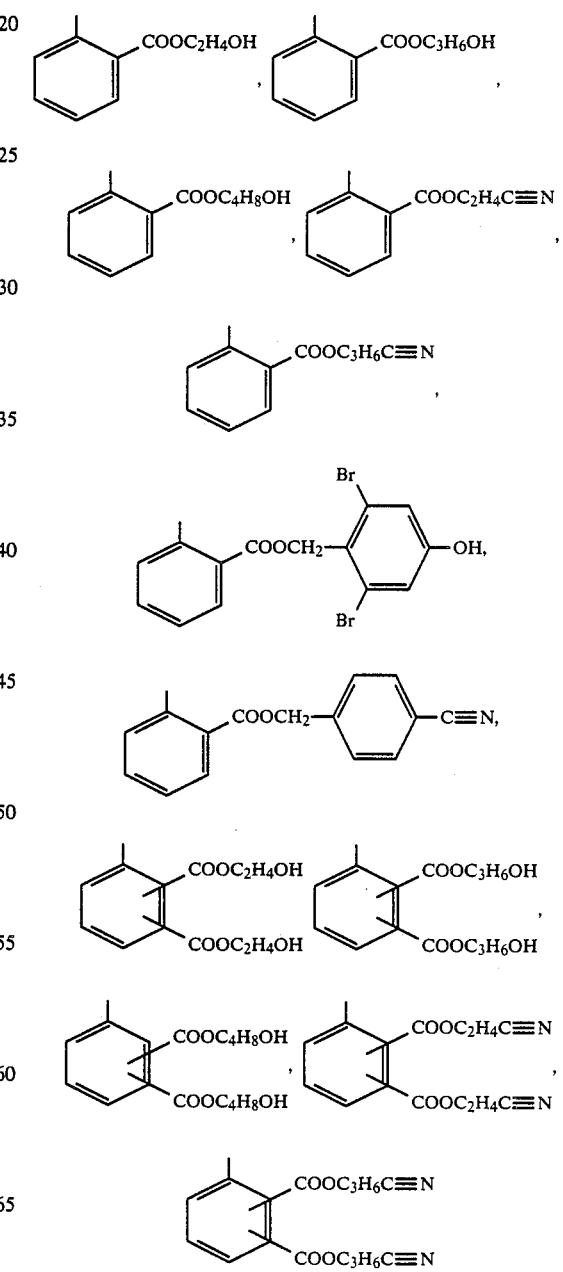

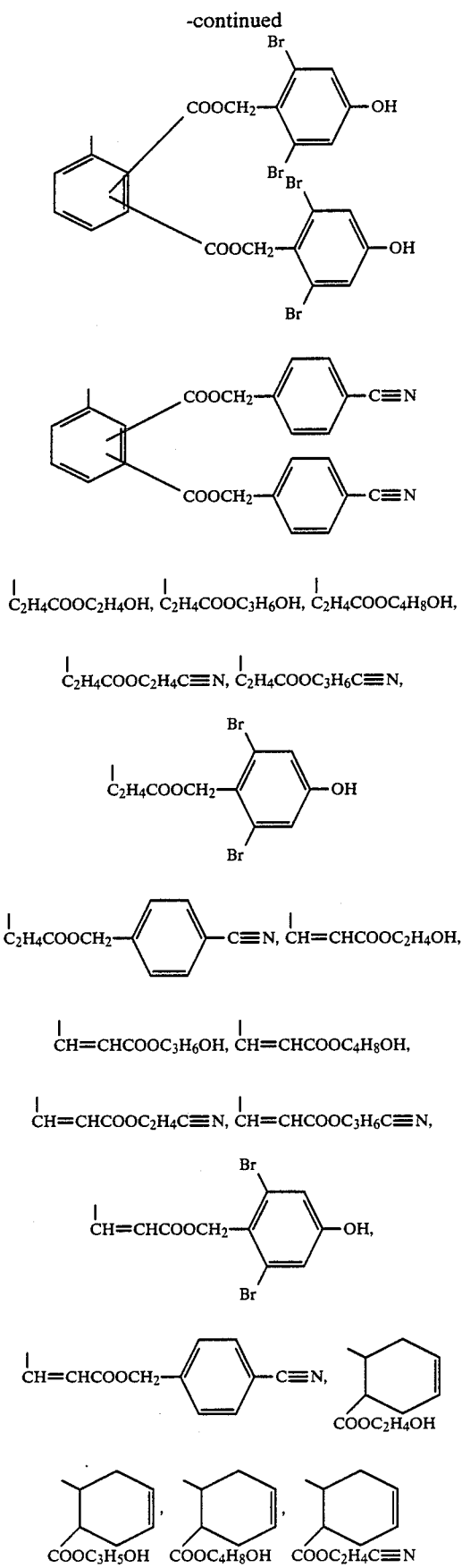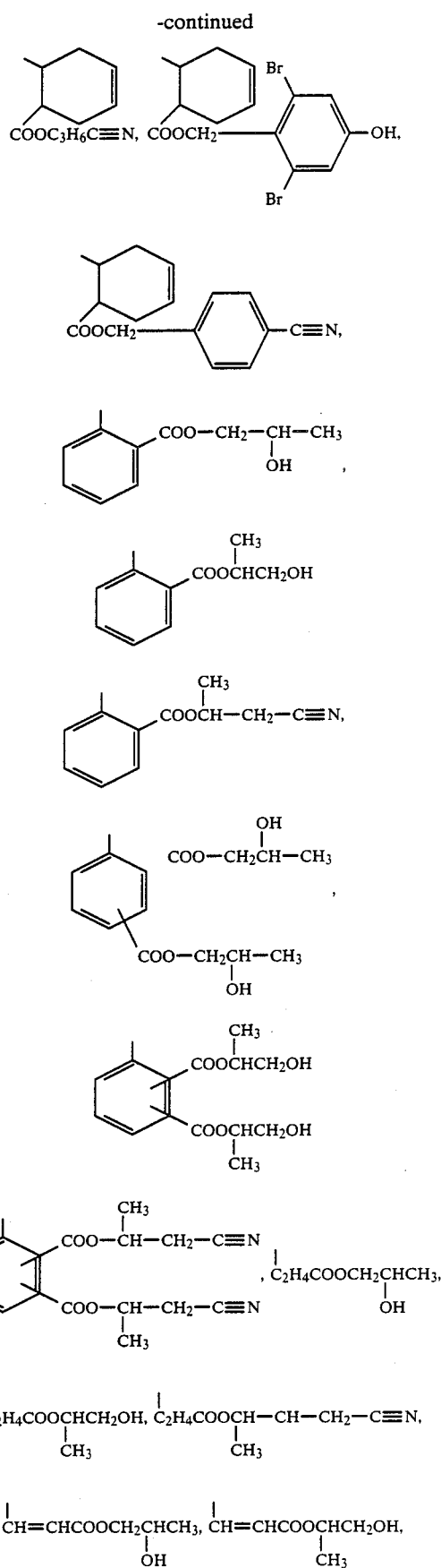

-continued

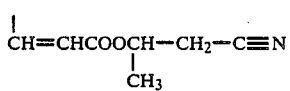 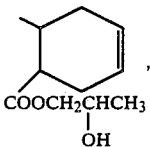,

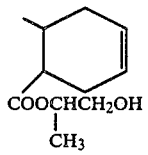 and 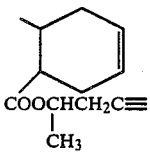

4. The light-sensitive composition of claim 1 wherein $n_1$ ranges from 25 to 70 mole%, $n_2$ ranges from 0 to 30 mole%, $n_3$ ranges from 0 to 15 mole%, $n_4$ ranges 10 to 55 mole% and $n_5$ ranges from 3 to 40 mole%.

5. The light-sensitive composition of claim 1 wherein $R_1$ is a hydrogen atom; methyl, ethyl, n-propyl, iso-propyl, methoxy, ethoxy, n-propoxy, iso-propoxy, hydroxymethyl, β-hydroxyethyl, γ-hydroxypropyl, methoxymethyl, ethoxymethyl, β-methoxymethyl, β-ethoxymethyl, hydroxy, carboxy, carbomethoxy or carboethoxy located at the 2'-, 3'- or 4'-positions, $R_2$ is a hydrogen atom, methyl, ethyl, n-propyl, iso-propyl or phenyl group, and $R_3$ is a hydrogen atom, methoxy, ethoxy, n-propoxy, or iso-propoxy group.

6. The light-sensitive composition of claim 1 wherein $R_4$ is n-hexyl, n-heptyl, n-octyl, n-nonyl, n-decyl, n-undecyl, n-dodecyl, n-tridecyl, n-tetradecyl, n-pentadecyl, n-hexadecy, n-heptadecy, or n-octadecyl located at the 4-position.

7. The light-sensitive composition of claim 6 wherein $R_4$ is n-dodecyl group located at the p-position.

8. The light-sensitive composition of claim 1 wherein the content of the modified polyvinyl acetal resin ranges from about 55 wt% to 95 wt% on the basis of the weight of the light-sensitive composition.

9. The light-sensitive composition of claim 1 wherein the content of the diazo resin represented by the formula (I) ranges from 3 to 20 wt% on the basis of the weight of the light-sensitive composition.

* * * * *